US012796393B2

(12) United States Patent
Tran et al.

(10) Patent No.: US 12,796,393 B2
(45) Date of Patent: Nov. 10, 2026

(54) CARRIER FOR REVERSIBLY IMMOBILIZING A DEVICE

(71) Applicant: DELPHON INDUSTRIES, LLC, Hayward, CA (US)

(72) Inventors: Victoria Tran, Hayward, CA (US); Rembrant Gamboa, Hayward, CA (US)

(73) Assignee: DELPHON INDUSTRIES, LLC, Hayward, CA (US)

( * ) Notice: Subject to any disclaimer, the term of this patent is extended or adjusted under 35 U.S.C. 154(b) by 710 days.

(21) Appl. No.: 18/450,076

(22) Filed: Aug. 15, 2023

(65) Prior Publication Data

US 2024/0222181 A1 Jul. 4, 2024

Related U.S. Application Data

(60) Provisional application No. 63/477,530, filed on Dec. 28, 2022.

(51) Int. Cl.
*B32B 3/10* (2006.01)
*H10P 72/70* (2026.01)

(52) U.S. Cl.
CPC .................................... *H10P 72/74* (2026.01)

(58) Field of Classification Search
None
See application file for complete search history.

(56) References Cited

U.S. PATENT DOCUMENTS 4,711,014 A 12/1987 Althouse
8,132,673 B1 * 3/2012 Gutentag ............... B65D 73/02
206/460
9,931,808 B1 4/2018 Varma et al.
10,991,272 B2 4/2021 Potter et al.
2012/0258271 A1 10/2012 Maughan
2018/0166313 A1 * 6/2018 Dai ........................ H10P 72/74

OTHER PUBLICATIONS

Reading Plastic & Metal Advanced Machining, "What It Means: Antistatic vs. Static Dissipative Plastic," Dec. 1, 2022, pp. 1-4, available at https://readingplastic.com/antistatic-vs-static-dissipative-plastic/.

* cited by examiner

*Primary Examiner* — Christopher M Polley
(74) *Attorney, Agent, or Firm* — EVENTIDE LAW LLC

(57) ABSTRACT

A carrier for reversibly immobilizing a device is disclosed. The carrier comprises: a carrier body having a carrying surface; an adhesive layer comprising an adhesive compound, being disposed on the carrying surface, and having a tack; and passivated elements comprising a tack deadening agent, being distributed on the adhesive layer, and being substantially tack free. The adhesive layer comprises passivated zones on which the passivated elements are distributed, boundary zones encircling the passivated elements, and a surrounding zone bordering the boundary zones. Upper surfaces of the passivated elements extend above upper surfaces of the passivated zones, boundary zones, and surrounding zone. The carrier can reversibly immobilize a device placed horizontally in contact with at least one passivated element based on pressing the passivated element such that its upper surface is even with the upper surface of the surrounding zone and the device contacts and adheres to the surrounding zone.

20 Claims, 7 Drawing Sheets

CARRIER FOR REVERSIBLY IMMOBILIZING A DEVICE

FIELD OF THE INVENTION

The present invention relates generally to carriers for reversibly immobilizing devices, and more particularly to carriers for reversibly immobilizing devices comprising (a) a carrier body having a carrying surface, (b) an adhesive layer comprising an adhesive compound, being disposed on the carrying surface, and having a tack, and (c) passivated elements comprising a tack deadening agent, being distributed on the adhesive layer, and being substantially tack free.

BACKGROUND OF THE INVENTION

Devices such as bare semiconductor chips are often temporarily secured on tacky or non-tacky carriers as they are transported from one process step to another. Tacky carriers include trays and boxes with laminated tape adhesives, such as Gel-Pak's Vacuum Release (VR) trays and AD series gel boxes. Non-tacky carriers include waffle packs, such as Gel-Pak's Lid/Clip Super System (LCS2) waffle pack, JEDEC trays, and tape and reel carriers.

Tacky carriers can be advantageous for transporting devices relative to non-tacky carriers. This is because placing devices on the tacky surface of a tacky carrier can immobilize the devices within the carrier and thus prevent damage from chipping and friction.

This advantage can be lost, though, during removal of the immobilized devices from tacky carriers. This is because removal of the immobilized devices from the surfaces of tacky carriers requires application of force, generally by an automated pick-up tool or alternatively by hand, to break the adhesion between the devices and the surfaces of tacky carriers. If the adhesion between devices and the surface of a tacky carrier is too strong, then the force required to remove the devices from the surface of the tacky carrier can be so great as to cause damage to the devices upon being picked up, or to cause an automated pick-up tool to fail to remove the devices from the surface of the tacky carrier at all.

Moreover, some devices include specific areas that are sensitive to adhesive removal force. Such areas include gold air bridges. For these devices, the specific areas on the device must not be put in contact with adhesives.

Thus, a need exists for improved carriers that provide the advantages of tacky carriers in terms of immobilizing devices within the carriers and thus preventing damage from chipping and friction, without adhesion between the devices and the surface of a tacky carrier being so strong as to result in damage to the devices upon being picked up and/or to prevent the devices from being picked up.

BRIEF SUMMARY OF THE INVENTION

A carrier for reversibly immobilizing a device is disclosed. The carrier comprises: (a) a carrier body having a carrying surface; (b) an adhesive layer comprising an adhesive compound, being disposed on the carrying surface, and having a tack; and (c) passivated elements comprising a tack deadening agent, being distributed on the adhesive layer, and being substantially tack free. The adhesive layer comprises passivated zones on which the passivated elements are distributed, boundary zones encircling the passivated elements, and a surrounding zone bordering the boundary zones. The passivated zones, the boundary zones, the surrounding zone, and the passivated elements have upper surfaces. The upper surfaces of the passivated elements extend above the upper surfaces of the passivated zones, the boundary zones, and the surrounding zone when no device is being reversibly immobilized by the carrier. The carrier is configured to reversibly immobilize a device placed horizontally in contact with at least one of the passivated elements based on the device pressing the at least one of the passivated elements toward the passivated zone under the at least one of the passivated elements such that the upper surface of the at least one of the passivated elements is even with the upper surface of the surrounding zone and the device contacts and adheres to the upper surface of the surrounding zone.

BRIEF DESCRIPTION OF THE DRAWINGS

These and other features, aspects, and advantages of the present disclosure are better understood when the following detailed description is read with reference to the accompanying drawings.

DETAILED DESCRIPTION OF THE INVENTION

Figure 1:
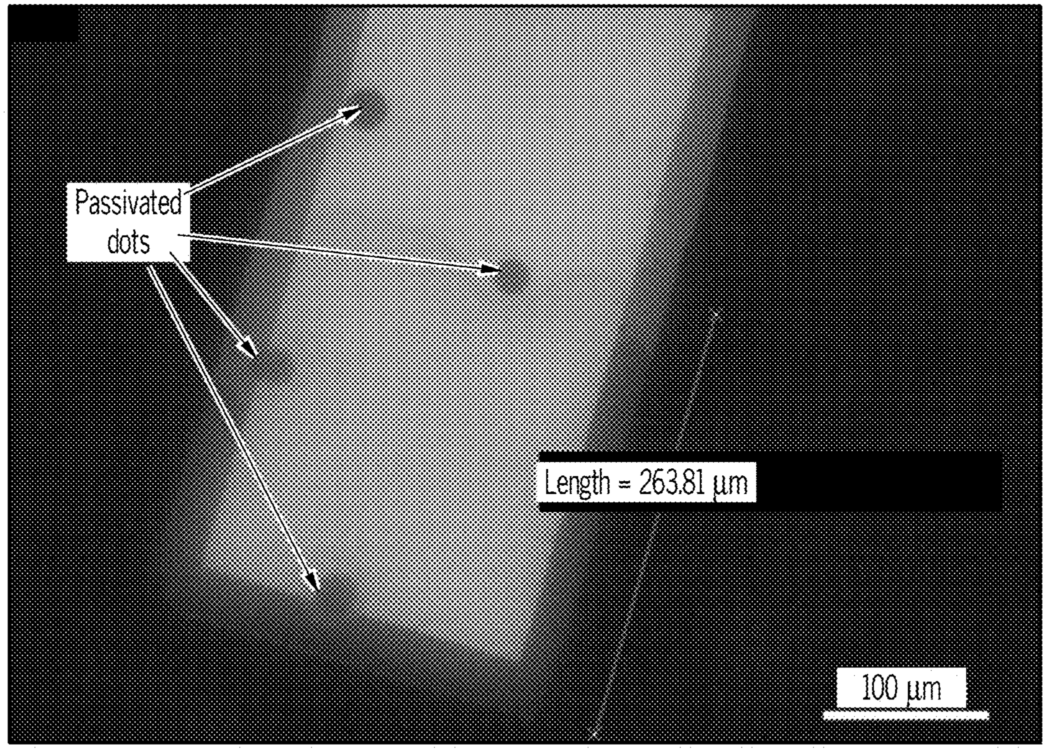
FIG. 1 shows an image of a carrier for reversibly immobilizing a device having a carrying surface including an adhesive layer on which an initial tack deadening agent has been printed and cured, forming passivated elements, with a device having a size of 750 μm×250 μm resting on the adhesive layer and the passivated elements.
Figure 2:
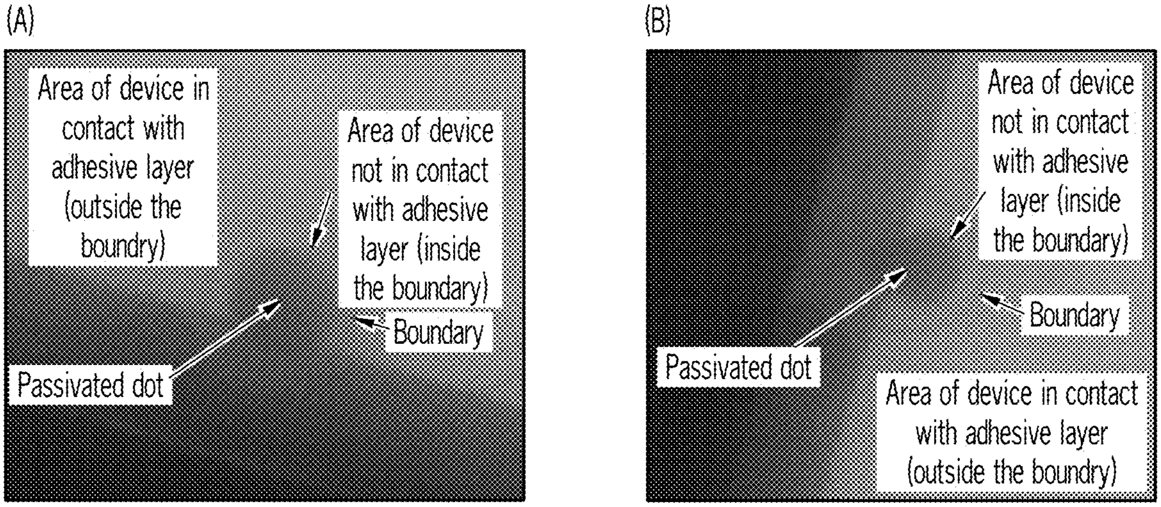
FIG. 2 shows expanded views of the image of the carrier and device of FIG. 1 including (A) first and (B) second examples of passivated elements of the carrier that are in contact with the device, boundary zones encircling the passivated elements that are not in contact with the device, and a surrounding zone bordering the boundary zones and in contact with the device. In these views, the passivated elements and boundaries are marked, the boundary zones are the areas between the boundaries and the passivated elements, and the surrounding zone is the area outside of the boundaries. Contact between the device and the surrounding zone is apparent based on wetting of a portion of the device above the surrounding zone. A lack of contact between the device and the boundary zones is apparent based on a lack of wetting of portions of the device above the boundary zones. Thus, the boundaries correspond to outlines of contact between the device and the adhesive layer.

As shown with reference to FIGS. 1-8, we have developed a carrier 100 for reversibly immobilizing devices 200, such as electronic components, wafers, semiconductor material wafers, silicon wafers, integrated circuit wafers, dies, semiconductor material dies, silicon dies, and/or integrated circuit dies, that allows us to limit adhesion of the devices 200 to the carrier 100 to any particular desired portions of the surfaces of the devices 200 facing the carrier 100 and to any particular desired degree of adhesion based on controlling the distribution and size of passivated elements 108 on an adhesive layer 106 of the carrier 100 and controlling the position and orientation of the devices 200 placed on the passivated elements 108. The carrier 100 comprises: (a) a carrier body 102 having a carrying surface 104; (b) an adhesive layer 106 comprising an adhesive compound, being disposed on the carrying surface 104, and having a tack; and (c) passivated elements 108 comprising a tack deadening agent, being distributed on the adhesive layer 106, and being substantially tack free. The adhesive layer 106 comprises passivated zones 110 on which the passivated elements 108 are distributed, boundary zones 112 encircling the passivated elements 108, and a surrounding zone 114 bordering the boundary zones 112. The passivated zones 110, the boundary zones 112, the surrounding zone 114, and the passivated elements 108 have upper surfaces 116, 118, 120, 122, respectively. The upper surfaces 122 of the passivated elements 108 extend above the upper surfaces 116, 118, 120 of the passivated zones 110, the boundary zones 112, and the surrounding zone 114 when no device 200 is being reversibly immobilized by the carrier 100.

Surprisingly, we have determined that by making the carrier 100 with a carrying surface 104 that supports an adhesive layer 106 uniformly across the carrying surface 104 and with the adhesive layer 106 being sufficiently soft, placing a device 200 horizontally in contact with at least one of the passivated elements 108 results in the device 200 pressing the at least one of the passivated elements 108 toward the passivated zone 110 thereunder such that the upper surface 122 of the at least one of the passivated elements 108 is even with the upper surface 120 of the surrounding zone 114 and the device 200 contacts and adheres to the upper surface 120 of the surrounding zone 114. This is so despite the passivated elements 108 having upper surfaces 122 that extend above upper surfaces 116, 118, 120 of the passivated zones 110, the boundary zones 112, and the surrounding zone 114 when no device 200 is reversibly immobilized to the carrier 100. This is because placing a device 200 horizontally on one or more passivated elements 108 of the carrier 100 causes the device 200 to press the passivated elements 108 toward the passivated zone 110 or passivated zones 110 thereunder, making the upper surfaces 122 of the one or more passivated elements 108 even with the upper surface 120 of the surrounding zone 114. The device 200 then can contact and adhere to the upper surface 120 of the surrounding zone 114.

We also have determined that by deadening the tack of the passivated zones 110 of the adhesive layer 106 of the carrier 100, the contact area between the adhesive layer 106 and a device 200 to be reversibly immobilized thereon is decreased, thereby decreasing the overall force required later to separate the device 200 from the adhesive layer 106. Using passivated elements 108 that comprise a tack deadening agent such that the passivated elements 108 are substantially tack free, e.g., lacking measurable tack, allows limiting adhesion to any particular desired portions of the surface of a device 200 and to any particular desired degree of adhesion. The device 200 adheres to the carrier 100 at the surrounding zone 114 based on the tack of adhesive layer 106, without adhering to the passivated elements 108. The passivated elements 108 can be distributed on the adhesive layer 106 of the carrier 100 and sized in relation to devices 200 to be immobilized, and the devices 200 can be placed on the passivated elements 108 specifically positioned and oriented to limit adhesion as desired.

Having determined this, we came to realize that a similar effect also can be achieved by using a carrier 100 in which the carrying surface 104 includes mesh points 124, such as a vacuum release tray, with the adhesive layer 106 being disposed on the carrying surface 104 based on being suspended from the mesh points 124, the passivated zones 110 being disposed between the mesh points 124, and the adhesive layer 106 being sufficiently flexible. Placing a device 200 horizontally in contact with at least one of the passivated elements 108 results in sagging of the passivated zone 110 under the at least one of the passivated elements 108 between the mesh points 124 when the device 200 presses the at least one of the passivated elements 108, allowing the device 200 to contact and adhere to the upper surface 120 of the surrounding zone 114, while also decreasing the contact area between the adhesive layer 106 and a device 200 to be reversibly immobilized thereon.

The approaches discussed above rely on gravity for instantaneous wetting of devices 200 by the adhesive of the surrounding zone 114 of the carrier 100. Other approaches may also be suitable, such as lamination and/or rolling to force contact between devices 200 and the adhesive of the surrounding zone 114, particularly for devices 200 that are not fragile.

The resulting carrier 100 including the adhesive layer 106 with the passivated elements 108 thereon allows devices 200 to be reversibly immobilized on the adhesive layer 106, thereby preventing damage from chipping and friction, while providing an overall adhesive force that is decreased relative to a carrier 100 including the adhesive layer 106 without the passivated elements 108, thereby decreasing the risk of damage to the devices 200 upon being picked up and/or the risk of the devices 200 not being picked up at all. Moreover, the devices 200 can be placed such that sensitive areas on the devices 200 will not have any contact with the adhesive layer 106. In addition, the passivated elements 108 can be grouped in passivated regions 126 on the adhesive layer 106, sized for example to prevent adhesion of a central portion of a device 200 while allowing adhesion of peripheral portions of the device 200, and distributed, for example to allow a plurality of the devices 200 to fit on and adhere to the adhesive layer 106. Furthermore, the carrier 100 can be used with a vacuum release technology to further reduce the tack of the adhesive layer 106 during picking of devices 200 from the carrier 100.

Figure 3:
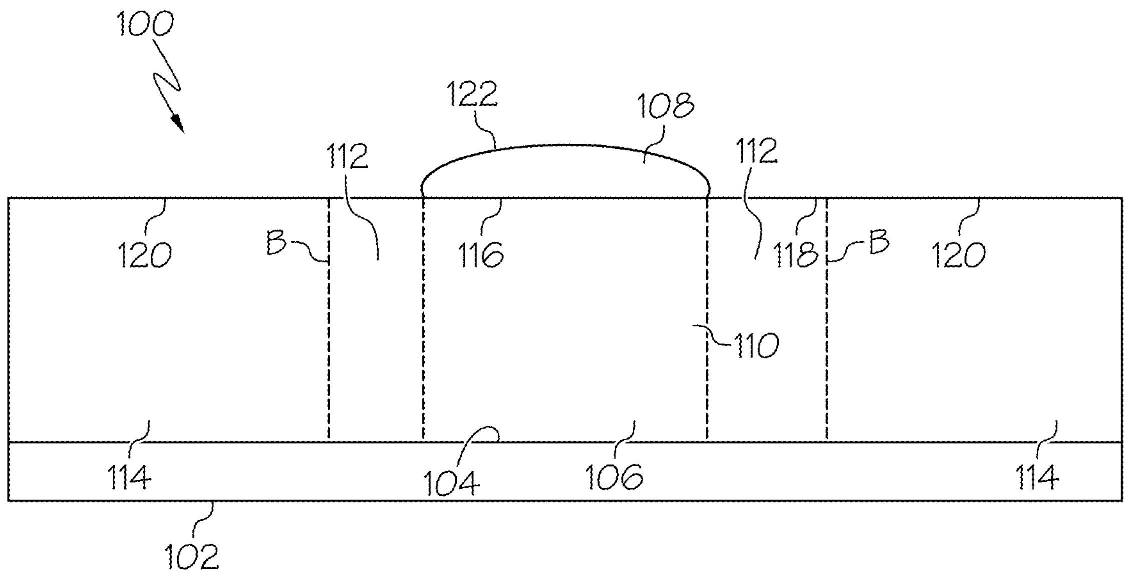
FIG. 3 shows a schematic sectional view of a carrier having a carrying surface including an adhesive layer with a passivated element formed thereon. The adhesive layer includes a passivated zone, corresponding to a zone below the passivated element as marked. The adhesive layer also includes a boundary zone encircling the passivated element, corresponding to a zone between the boundary B as marked and the passivated element. The adhesive layer also includes a surrounding zone bordering the boundary zone, corresponding to a zone outside of the boundary B as marked. Note that the position of the boundary B may vary depending on, for example, the size, shape, and weight of the device and how the device is positioned with respect to the passivated element and the adhesive layer.
Figure 4:
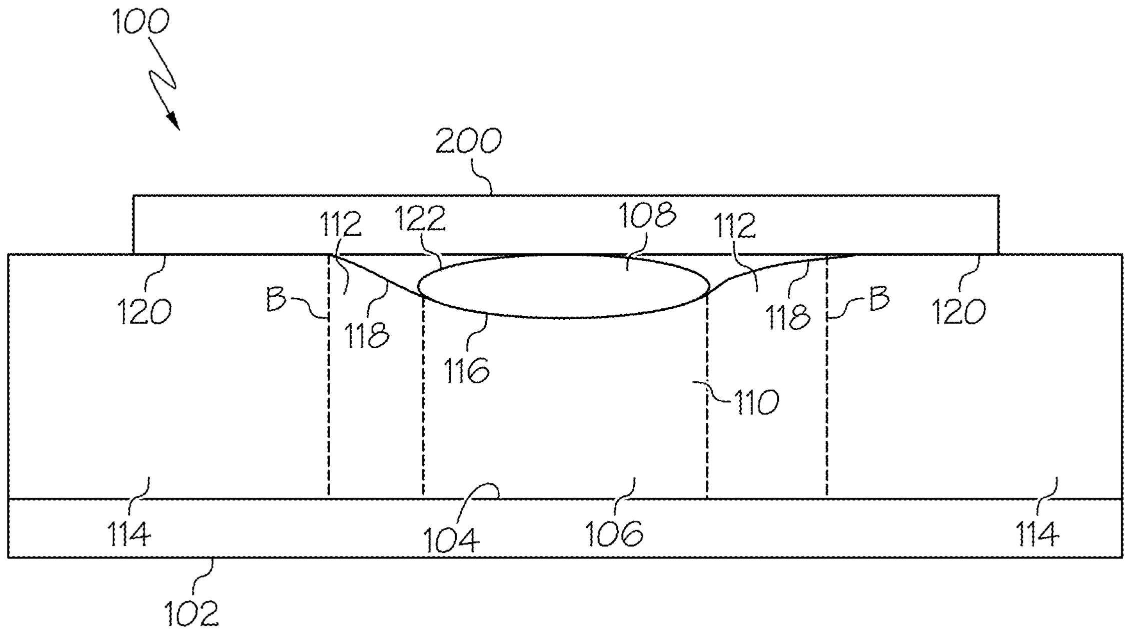
FIG. 4 shows a schematic sectional view of the carrier of FIG. 3 on which a device has been placed. Placing a device horizontally in contact with the passivated element results in the device pressing the passivated element toward the passivated zone thereunder. The upper surface of the passivated element then becomes even with the upper surface of the surrounding zone and the device contacts and adheres to the upper surface of the surrounding zone. As can be seen, the device is in contact with the passivated element and the surrounding zone, but not the passivated zone under the passivated element or the boundary zone encircling the passivated element. It is in this way that a boundary B corresponds to an outline of contact between a device and the adhesive layer.
Figure 5:
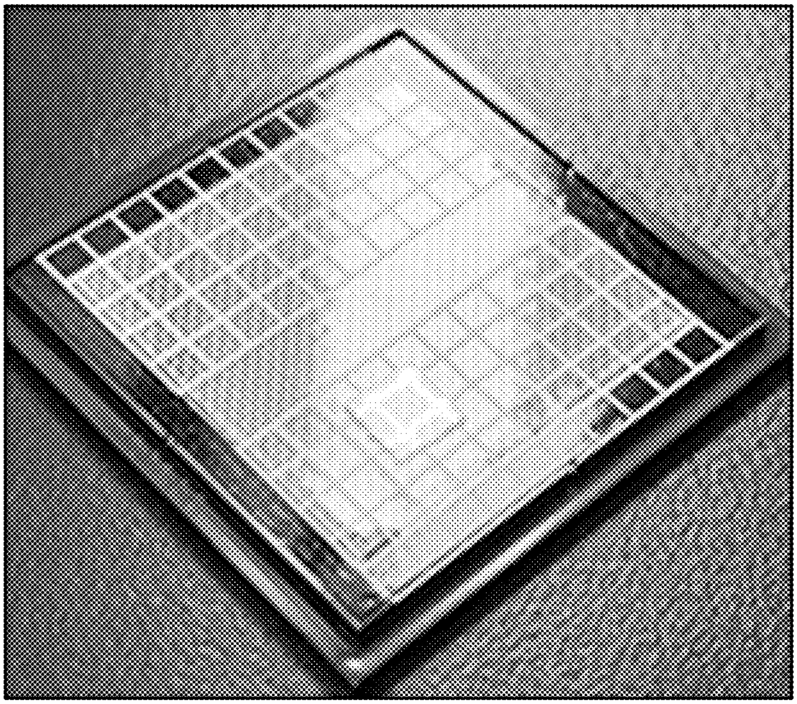
FIG. 5 shows a photograph of a carrier corresponding to a vacuum release tray having a carrying surface including an adhesive layer on which an initial tack deadening agent has been printed and cured to form passivated elements grouped in a grid pattern to form passivated regions, and on which a device corresponding to a glass die has been placed.
Figure 6:
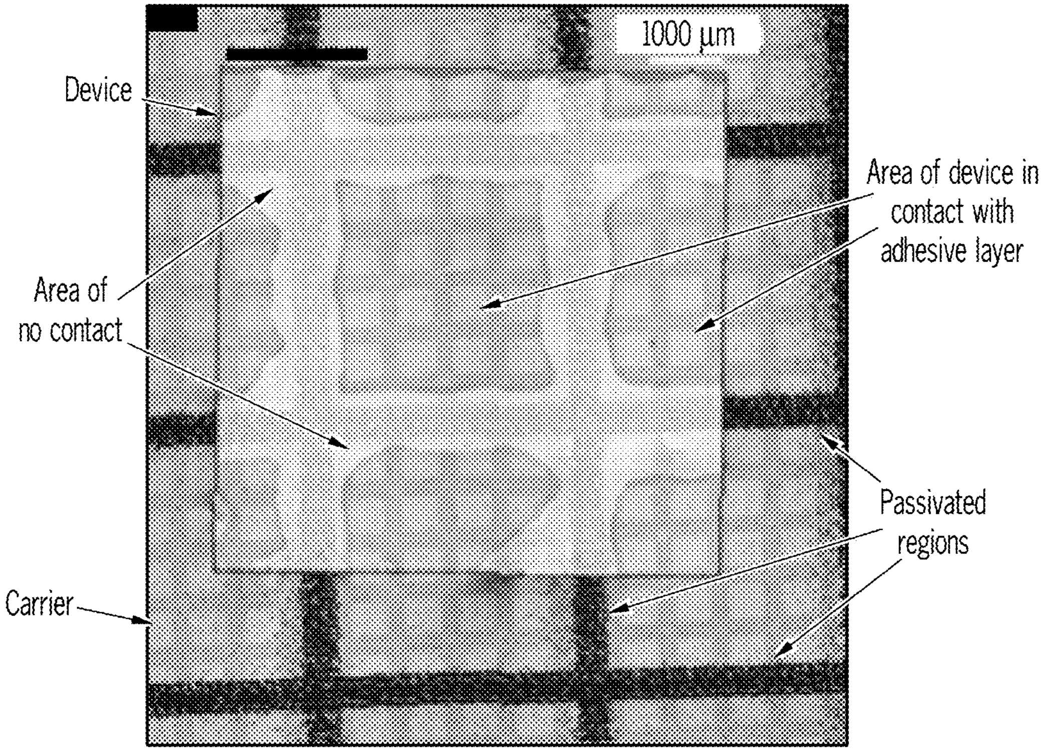
FIG. 6 shows a micrograph of an expanded view of the vacuum release tray and glass die of FIG. 5. The glass die does not adhere to the passivated regions despite being in contact with them, as can be seen by the absence of wetting of the glass die along lines of the grid pattern corresponding to the passivated regions. The glass die is able to contact the adhesive layer regions adjacent to the passivated regions, as can be seen by wetting of the glass die between the lines of the grid pattern.

Considering the carrier 100 in more detail, as shown in FIG. 3 and FIG. 4, the carrier 100 comprises a carrier body 102 having a carrying surface 104. In some embodiments, the carrier body 102 is one or more of a tray, a box, or a film frame. The tray can be, for example, a JEDEC tray. The carrying surface 104 is the surface on which the device 200 will be carried.

The carrier 100 also comprises an adhesive layer 106 comprising an adhesive compound and being disposed on the carrying surface 104. Adhesive chemistries that should work well include adhesives with surface energies greater than or equal to 40 dynes such as acrylic and urethane adhesives. Silicone adhesives and adhesives with lower surface energies may require priming. The adhesive layer 106 can be, for example, a single layer of adhesive film such as Gel-Pak DGL, or a construction of adhesive tape such as Nitto's ELEP HOLDER wafer dicing tape. Thus, in some embodiments, the adhesive compound comprises one or more of an adhesive with a surface energy of greater than or equal to 40 dynes, a urethane adhesive, an acrylic adhesive, or a primed silicone adhesive. In some embodiments, the adhesive layer 106 is one or more of a film or a gel. In some embodiments, the adhesive layer 106 comprises one or more of a crosslinked aliphatic urethane, a crosslinked aliphatic urethane comprising ethyl carbamate, a crosslinked aromatic urethane, or a crosslinked thermoset urethane.

The carrier 100 also comprises passivated elements 108 comprising a tack deadening agent. The passivated elements 108 are distributed on the adhesive layer 106. The passivated elements 108 are substantially tack free.

The passivated elements 108 can be formed on the adhesive layer 106 by applying an initial agent on the adhesive layer 106 as discrete elements, for example by printing, and then curing the initial agent to form the passivated elements 108 including the tack deadening agent, for example by crosslinking or drying. The initial agent can comprise polymers that are crosslinkable and that can easily adhere to the adhesive layer 106 and bond permanently thereto once crosslinked. The initial agent should have properties of a good printing ink, in that it can be applied to the adhesive layer 106 and does not bleed or bead up once applied. One example of a suitable initial agent is an acrylate-based inkjet ink, PLT-FJW #60, from Engineered Printing Solutions. Other acrylate-based inkjet inks and other acrylate-based compounds should also be suitable.

The initial agent can be applied by printing a thin layer in a liquid state on the adhesive layer 106. Various printing methods can be employed, such as inkjet, screen, transfer, or pad printing. The initial agent must be applied in a thin layer over the adhesive layer 106. This allows the tacky surfaces of the surrounding zone 114 of the adhesive layer 106 bordering the boundary zones 112 encircling the passivated zones 110 to be available to contact a device 200 to be immobilized. If the initial agent is applied too thick and wide relative to the device 200 to be immobilized, the device 200 will only sit on the resulting passivated elements 108 and not contact the surrounding zone 114 of the adhesive layer 106.

The initial agent then can be cured, for example by crosslinking or drying. This converts the initial agent from the liquid state to a solid state that is substantially tack free. Regarding crosslinking in particular, suitable crosslinking mechanisms include free radical crosslinking through molecular double bonds, diazo crosslinking, and 2-2 cycloaddition crosslinking. The resulting crosslinked tack deadening agent does not degrade or significantly swell the adhesive layer 106 and does not have appreciable residue after curing.

The passivated elements 108 can be distributed on the adhesive layer 106 as discrete elements and/or overlapping elements, depending on the density of application of the initial agent. For example, for passivated elements 108 applied based on inkjet printing, the passivated elements 108 can be distributed as discrete and/or overlapping passivated dots. Also for example, for passivated elements 108 applied based on other printing methods, the passivated elements 108 can be distributed as passivated solid print elements. The passivated elements 108 thus can form islands of discrete elements or overlapping elements distributed across the adhesive layer 106.

Thus, in some embodiments, the passivated elements 108 have been distributed on the adhesive layer 106 by applying an initial agent onto the adhesive layer 106, and then curing the initial agent on the adhesive layer 106 to form the tack deadening agent. In some of these embodiments, the curing comprises crosslinking and the tack deadening agent comprises a crosslinked tack deadening agent. Also in some of these embodiments, the crosslinked tack deadening agent comprises one or more of a crosslinked acrylic resin or a UV-crosslinked acrylic resin. Also in some of these embodiments, the crosslinking of the initial agent comprises one or more of free radical crosslinking through molecular double bonds, diazo crosslinking, or 2-2 cyclo-addition crosslinking. Also in some of these embodiments, the applying comprises printing. Also in some of these embodiments, the printing comprises one or more of inkjet printing, silk screen printing, transfer printing, or pad printing. Also in some of these embodiments, the initial agent comprises an acrylate-based inkjet printer ink.

The adhesive layer 106 comprises passivated zones 110 on which the passivated elements 108 are distributed, boundary zones 112 encircling the passivated elements 108, and a surrounding zone 114 bordering the boundary zones 112. The passivated zones 110, the boundary zones 112, the surrounding zone 114, and the passivated elements 108 have upper surfaces 116, 118, 120, 122, respectively. The upper surfaces 122 of the passivated elements 108 extend above the upper surfaces 116, 118, 120 of the passivated zones 110, the boundary zones 112, and the surrounding zone 114 when no device 200 is being reversibly immobilized by the carrier 100.

As shown schematically in FIG. 3 and FIG. 4 with respect to a single passivated element, and as shown in images in FIGS. 5-8 with respect to a plurality of passivated elements, the carrier 100 is configured to reversibly immobilize a device 200 placed horizontally in contact with at least one of the passivated elements 108 based on the device 200 pressing the at least one of the passivated elements 108 toward the passivated zone 110 under the at least one of the passivated elements 108 such that the upper surface 122 of the at least one of the passivated elements 108 is even with the upper surface 120 of the surrounding zone 114 and the device 200 contacts and adheres to the upper surface 120 of the surrounding zone 114.

In some embodiments, the carrying surface 104 supports the adhesive layer 106 uniformly across the carrying surface 104, and the carrier 100 is configured to reversibly immobilize the device 200 based on the adhesive layer 106 being sufficiently soft for the device 200 to press the at least one of the passivated elements 108 toward the passivated zone 110 under the at least one of the passivated elements 108 despite the carrying surface 104 supporting the adhesive layer 106 uniformly across the carrying surface 104. This can be advantageous for use with carriers 100 having flat carrying surfaces 104.

In some embodiments, the carrying surface 104 comprises mesh points 124, the adhesive layer 106 is disposed on the carrying surface 104 based on being suspended from the mesh points 124, the passivated zone 110 is disposed between the mesh points 124, and the carrier 100 is configured to reversibly immobilize the device 200 based on the adhesive layer 106 being sufficiently flexible for the passivated zone 110 under the at least one of the passivated elements 108 to sag between the mesh points 124 when the device 200 presses the at least one of the passivated elements 108. Mesh points 124 can be formed by crossing of mesh fibers. At each mesh point 124, the mesh fiber extends either upward or downward, due to the mesh fibers being woven. This configuration can be advantageous for use in combination with vacuum release, such as with Gel-Pak's VR trays, for removal of the devices 200 from the carrier 100. This also can be advantageous for use with flexible tapes on a film frame, in which the adhesive layer 106 of the flexible tapes can be physically adjusted above the plane of the passivated elements 108.

Figure 7:
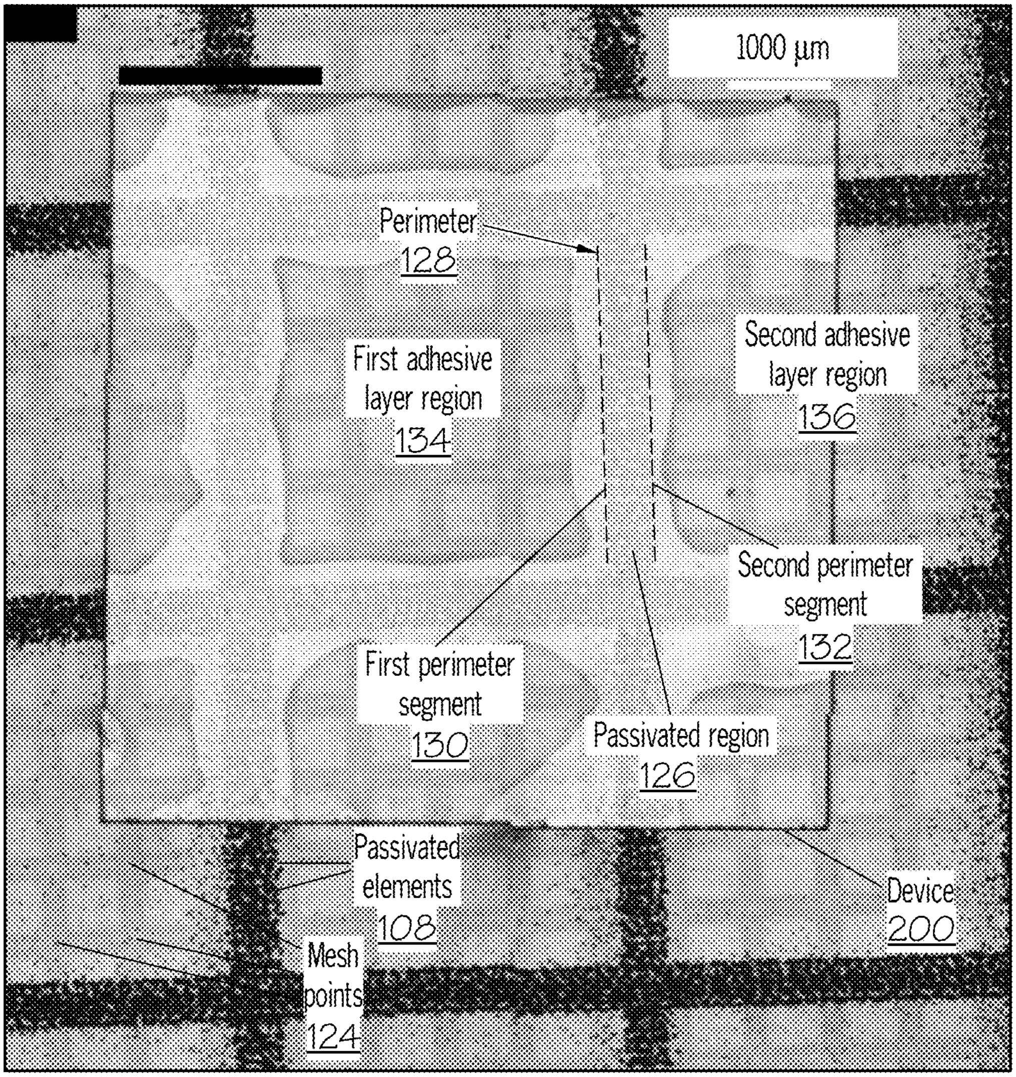
FIG. 7 shows an expanded view of the micrograph of the vacuum release tray and glass die of FIG. 6, including examples of a passivated region, first and second perimeter segments of the passivated region, and first and second adhesive layer regions adjacent the first and second perimeter segments. The adhesive layer and the passivated regions of the vacuum release tray are configured to allow the glass die to contact the first and second adhesive layer regions adjacent the first and second perimeter segments of the passivated regions when the glass die is placed horizontally on at least one of the passivated regions.
Figure 8:
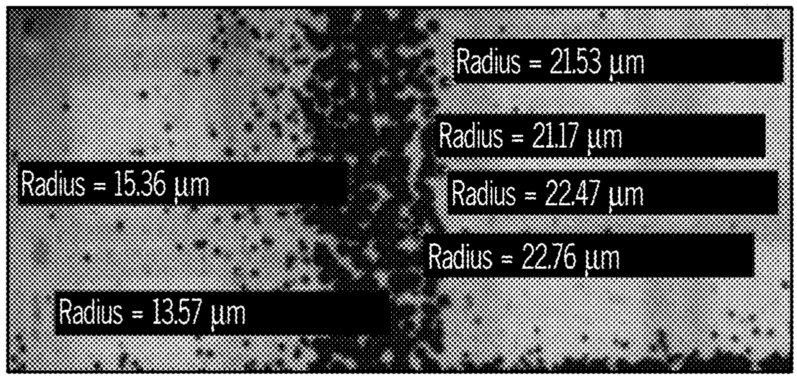
FIG. 8 shows a micrograph of an expanded view of the vacuum release tray of FIG. 5 including a passivated region. Radii of various passivated elements are shown.

With reference to FIG. 7 and FIG. 8, the width of the passivated elements 108 affects suitability of the carrier 100 for carrying particular devices 200. The upper limit of the width of the passivated elements 108 is generally determined by the size of the devices 200 to be carried by the carrier 100. The carrier 100 may be used to carry devices 200 having areas ranging, for example, from 250 μm×250 μm to 10 mm×10 mm or larger. The width of the passivated elements 108 should be sufficiently smaller than the widths of the devices 200 to be carried to allow a device 200 placed on a passivated element 108 to reach the surrounding zone 114 of the adhesive layer 106 on opposing sides of the passivated element 108. The lower limit of the width of the passivated elements 108 is generally determined by the limit of resolution of the method for applying and curing the initial agent. For inkjet printing this is currently about 10 to 20 μm. Thus, as an example, for carriers 100 for devices 200 that are 250 μm×250 μm, each passivated element 108 can have a width of about 10 μm to 150 μm, e.g., 10 μm to 125 μm, 10 μm to 100 μm, 10 to 75 μm, 10 μm to 50 μm, or 10 to 30 μm. Thus, in some embodiments, each passivated element 108 has a width of about 10 μm to 125 μm, 10 μm to 100 μm, 10 to 75 μm, 10 μm to 50 μm, or 10 to 30 μm.

The combination of the softness and/or flexibility of the adhesive layer 106 and the thickness of the passivated elements 108 also affects suitability of the carrier 100 for carrying particular devices 200. Once a device 200 has been placed on one or more passivated elements 108 and is in contact with the surrounding zone 114 of the adhesive layer 106, the force of adhesion between the device 200 and the surrounding zone 114 must be greater than the spring force of the passivated zone 110 of the adhesive layer 106 in order for the device 200 to remain adhered to the surrounding zone 114. If the force of adhesion is greater than the spring force, the device 200 can remain in contact with the surrounding zone 114. If the spring force exceeds the force of adhesion, the device 200 will become delaminated from the surrounding zone 114. Increasing softness and/or flexibility of the adhesive layer 106 and decreasing thickness of the passivated elements 108 tends to favor the force of adhesion over the spring force. Regarding the passivated elements 108 in particular, the thickness of the passivated elements 108 is generally determined by the method for applying and curing the initial agent. For inkjet printing a typical thickness of passivated elements 108 is about 6 to 20 μm. Thus, in some embodiments, the passivated elements 108 have a thickness of about 6 μm to 20 μm.

Figure 9:
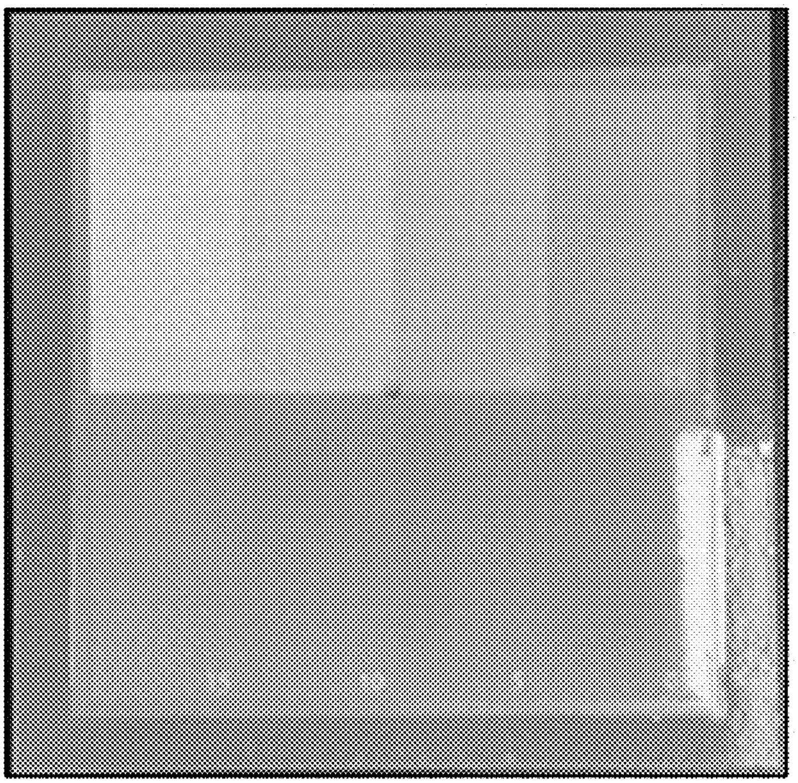
FIG. 9 is an image of a vacuum release tray including a carrying surface including an adhesive layer with passivated elements printed and cured thereon. The tray includes various areas on which the passivated elements were printed at different print densities, resulting in various areas with different passivated-element opacities.

With reference to FIG. 9, passivated-element opacity of the adhesive layer 106 also affects suitability of the carrier for carrying particular devices 200. Passivated-element opacity means the area of the upper surface of the adhesive layer 106 that is covered by passivated elements 108 per total area of the upper surface of the adhesive layer 106. This can be calculated, for example, by dividing the sum of the areas of the passivated zones 110 of a carrier 100 by the area of the adhesive layer 106 of the carrier 100, and can be expressed, for example, as a ratio, fraction, or percentage. Passivated elements 108 should be applied to an opacity high enough to avoid adhesion between devices 200 and the tacky surface of the adhesive layer 106 being so strong as to result in damage to the devices 200 upon being picked up and/or to prevent the devices 200 from being picked up, but not so high as to preclude immobilizing devices 200 by the carriers 100. Passivated-element opacities can range from 1% to 99% of the area of the adhesive layer 106, e.g., 1% to 70%, 1% to 50%, 1% to 40%, 1% to 30%, 1% to 20%, 1% to 15%, 1% to 10%, or 1% to 5%. Thus, in some embodiments, the sum of the areas of the passivated zones 110 equals 1% to 99% of the area of the adhesive layer 106, e.g., 1% to 70%, 1% to 50%, 1% to 40%, 1% to 30%, 1% to 20%, 1% to 15%, 1% to 10%, or 1% to 5%.

The overall tack of the adhesive layer 106 with the passivated elements 108 distributed thereon also affects suitability of the carrier 100 for carrying particular devices 200. Conversely as for passivated-element opacity, the overall tack of the adhesive layer 106 with the passivated elements 108 distributed thereon should be low enough to avoid adhesion between devices 200 and the tacky surface of the adhesive layer 106 being so strong as to result in damage to the devices 200 upon being picked up and/or to prevent the devices 200 from being picked up, but not so low as to preclude immobilizing devices 200 by the carriers 100. Overall tack of an adhesive layer 106 with the passivated elements 108 distributed thereon can range from 5% to 95% of an overall tack of the adhesive layer 106 without the passivated elements 108 distributed thereon, e.g., 10% to 94%, 20% to 93%, 30% to 92%, 40% to 91%, or 50% to 90%. Thus, in some embodiments, the adhesive layer 106 with the passivated elements 108 distributed thereon has an overall tack that is 5% to 95% of an overall tack of the adhesive layer 106 without the passivated elements 108 distributed thereon, e.g., 10% to 94%, 20% to 93%, 30% to 92%, 40% to 91%, or 50% to 90%.

With reference to FIGS. 5-8, the passivated elements 108 can be distributed on the adhesive layer 106 in groups to form passivated regions 126 at specific locations to which devices 200 can be applied in particular positions and orientations. The passivated regions 126 can have higher passivated-element opacities, and thus lower overall tacks, than adjacent regions of the adhesive layer 106 on opposing side of the passivated regions 126. The passivated regions 126 can be sized, for example, to prevent adhesion of a central portion of a device 200 while allowing adhesion of peripheral portions of the device 200. The passivated regions 126 can be distributed, for example, to allow a plurality of devices 200 to fit on and adhere to the adhesive layer 106.

Thus, in some embodiments, the passivated elements 108 are grouped in passivated regions 126 on the adhesive layer 106. In these embodiments, each passivated region 126 has a perimeter 128 that has a first perimeter segment 130 and an opposing second perimeter segment 132. Each passivated region 126 is bordered by a first adhesive layer region 134 at the first perimeter segment 130 of the passivated region 126 and a second adhesive layer region 136 at the second perimeter segment 132 of the passivated region 126. Each passivated region 126 has a tack that is less than the tack of the adhesive layer 106. The adhesive layer 106 and the passivated regions 126 are configured to allow a device 200 to contact the first and second adhesive layer regions 134, 136 adjacent the first and second perimeter segments 130, 132 of at least one of the passivated regions 126 when the device 200 is placed horizontally on the at least one of the passivated regions 126.

In some of these embodiments, the passivated regions 126 have shapes that are one or more of circular, oval, triangular, square, rectangular, or irregular. Also in some of these embodiments, the passivated regions 126 have areas of 200 μm×200 μm to 10 mm×10 mm. Also in some of these embodiments, the sum of the areas of the passivated regions 126 equals 5% to 95% of the area of the adhesive layer 106. Also in some of these embodiments, the sum of the areas of the passivated zones 110 within the passivated region 126 equals 1% to 100% of the area of the passivated region. 126 Also in some of these embodiments, the tack of at least one of the passivated regions 126 is at least 2-fold, 3-fold, 4-fold, 5-fold, or 10-fold lower than the tack of the adhesive layer 106. These embodiments can be advantageous for shaping and sizing the passivated regions 126 and passivated zones 110 therein to be complementary to devices 200 to be carried, and to tailor the tack provided by the passivated regions 126 to the devices 200 to be carried.

Also, in some embodiments, the device 200 to be immobilized has a lateral dimension that is greater than a lateral dimension of at least one of the passivated regions 126, thereby allowing the device 200 to extend beyond the first and second perimeter segments 130, 132 of the at least one of the passivated regions 126 when the device 200 is placed horizontally on the at least one of the passivated regions 126. This can be advantageous for allowing such a device 200 to extend across such passivated regions 126 so that portions of the surfaces of the device 200 can contact the first and second adhesive layer regions 134, 136 adjacent the first and second perimeter segments 130, 132 of the passivated regions 126.

Again with reference to FIGS. 5-8, in some embodiments the adhesive layer 106 is disposed on the carrying surface 104 based on being suspended from mesh points 124, the passivated regions 126 being formed on the adhesive layer 106 such that some portions of the passivated regions 126 are disposed above mesh points 124 and other portions of the passivated regions 126 are disposed between mesh points 124. This can be advantageous as the mesh points 124 disposed between the passivated regions 126 can help with instantaneous wetting of the adhesive layer 106 to a device 200 placed on the adhesive layer 106, whereas the portions of the passivated regions 126 disposed above mesh points 124 provide lower tack above those mesh points 124 in comparison to the mesh points 124 disposed between the passivated regions 126.

The adhesive layer 106 can be provided with static dissipative properties to protect devices 200 to be carried. Static dissipative properties can be provided by materials with surface resistances greater than or equal to $10^9$ ohms, e.g., $10^9$ ohms to $10^{12}$ ohms. Thus, in some embodiments, the adhesive layer 106 has static dissipative properties with a surface resistance of greater than or equal to $10^9$ ohms both with and without the passivated elements 108 distributed thereon, e.g., $10^9$ ohms to $10^{12}$ ohms.

Exemplary results for use of the carrier 100 with various devices 200 include the following.

Figure 10:
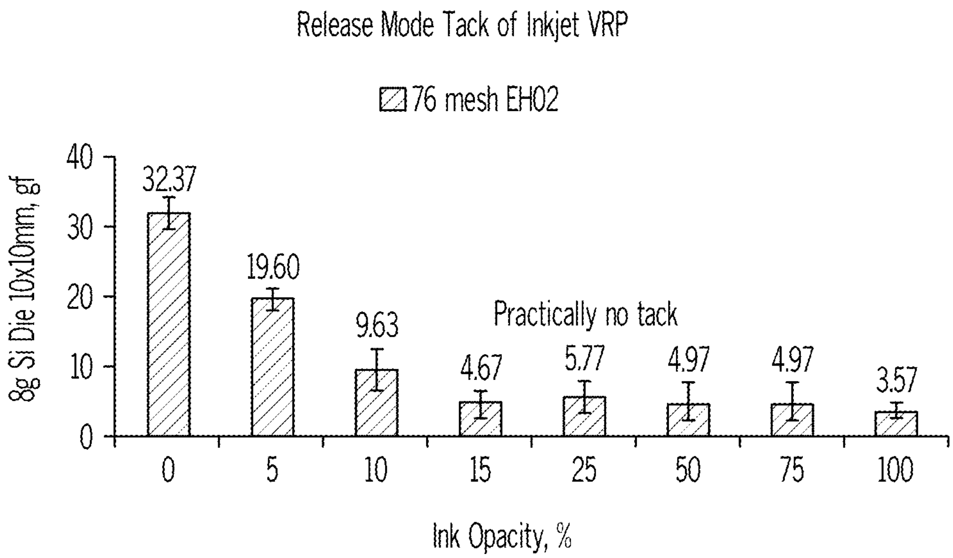
FIG. 10 shows results of tack force required for release of a device corresponding to an 8 g silicon die of 10 mm×10 mm size from a vacuum release tray including a carrying surface including an adhesive layer with passivated elements printed and cured at varying print densities.

FIG. 10 shows results of tack force required for release of a device corresponding to an 8 g silicon die of 10 mm×10 mm size from a vacuum release tray including a carrying surface including an adhesive layer with passivated elements printed and cured at varying print densities. As can be seen, increasing print densities from an ink opacity of 0% to an ink opacity of 100% result in a substantial decrease in the tack force needed to remove the device.

Figure 11:
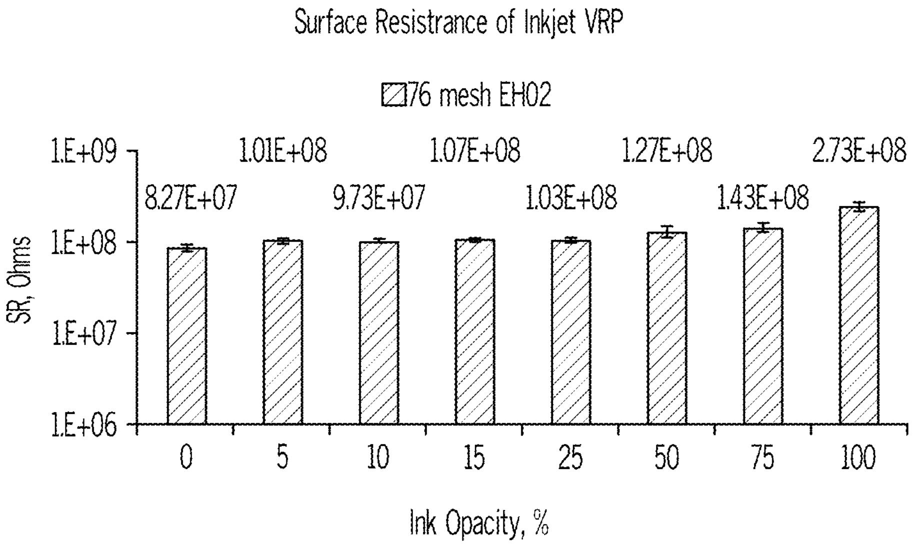
FIG. 11 shows results of surface resistance of films corresponding to an adhesive layer on which an initial tack deadening agent has been printed at varying print densities and cured.

FIG. 11 shows results of surface resistance of films corresponding to an adhesive layer on which an initial tack deadening agent has been printed at varying print densities and cured. As can be seen, this does not substantially change surface resistance of the film, even at an ink opacity of 100%.

Figure 12:
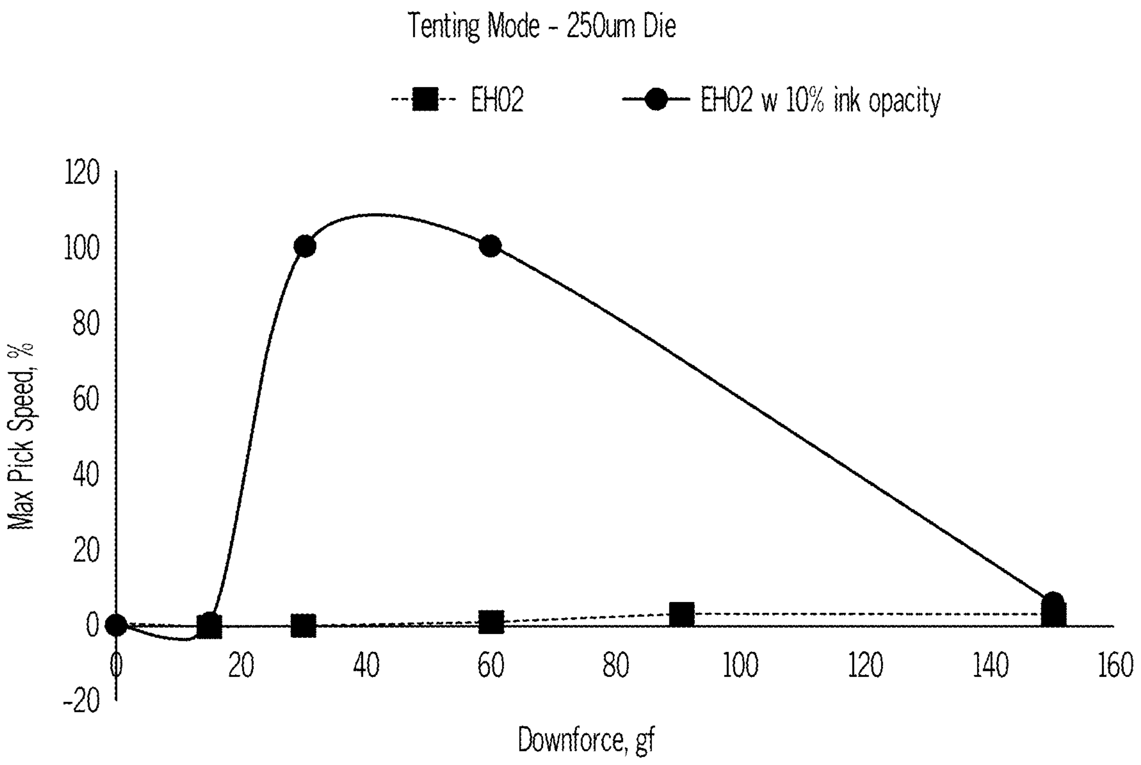
FIG. 12 shows results for a comparison of maximum pick speed (%) per downforce (gf) for picking of small dies (250 μm) from EH02 gel and EH02 gel with a homogenous 10% ink opacity pattern.

FIG. 12 shows results for a comparison of maximum pick speed (%) per downforce (gf) for picking of small dies (250 μm) from EH02 gel with a homogenous 10% ink opacity pattern versus untreated EH02 gel. As can be seen, printing of the homogeneous 10% ink opacity pattern on the EH02 gel lowers the tack, allowing faster picking of the small dies, up to 100% of the maximum pick speed at low downforce.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention.

The invention claimed is:

1. A carrier for reversibly immobilizing a device comprising:

(a) a carrier body having a carrying surface;

(b) an adhesive layer comprising an adhesive compound, being disposed on the carrying surface, and having a tack; and (c) passivated elements comprising a tack deadening agent, being distributed on the adhesive layer, and being substantially tack free, wherein:

the adhesive layer comprises passivated zones on which the passivated elements are distributed, boundary zones encircling the passivated elements, and a surrounding zone bordering the boundary zones;

the passivated zones, the boundary zones, the surrounding zone, and the passivated elements have upper surfaces;

the upper surfaces of the passivated elements extend above the upper surfaces of the passivated zones, the boundary zones, and the surrounding zone when no device is being reversibly immobilized by the carrier; and the carrier is configured to reversibly immobilize a device placed horizontally in contact with at least one of the passivated elements based on the device pressing the at least one of the passivated elements toward the passivated zone under the at least one of the passivated elements such that the upper surface of the at least one of the passivated elements is even with the upper surface of the surrounding zone and the device contacts and adheres to the upper surface of the surrounding zone.

2. The carrier according to claim 1, wherein:

the carrying surface supports the adhesive layer uniformly across the carrying surface; and the carrier is configured to reversibly immobilize the device based on the adhesive layer being sufficiently soft for the device to press the at least one of the passivated elements toward the passivated zone under the at least one of the passivated elements despite the carrying surface supporting the adhesive layer uniformly across the carrying surface.

3. The carrier according to claim 1, wherein:

the carrying surface comprises mesh points;

the adhesive layer is disposed on the carrying surface based on being suspended from the mesh points;

the passivated zone is disposed between the mesh points; and the carrier is configured to reversibly immobilize the device based on the adhesive layer being sufficiently flexible for the passivated zone under the at least one of the passivated elements to sag between the mesh points when the device presses the at least one of the passivated elements.

4. The carrier according to claim 1, wherein the carrier body is one or more of a tray, a box, or a film frame.

5. The carrier according to claim 1, wherein the adhesive compound comprises one or more of an adhesive with a surface energy of greater than or equal to 40 dynes, a urethane adhesive, an acrylic adhesive, or a primed silicone adhesive.

6. The carrier according to claim 1, wherein the adhesive layer is one or more of a film or a gel.

7. The carrier according to claim 1, wherein the adhesive layer comprises one or more of a crosslinked aliphatic urethane, a crosslinked aliphatic urethane comprising ethyl carbamate, a crosslinked aromatic urethane, or a crosslinked thermoset urethane.

8. The carrier according to claim 1, wherein the passivated elements have been distributed on the adhesive layer by applying an initial agent onto the adhesive layer, and then curing the initial agent on the adhesive layer to form the tack deadening agent.

9. The carrier according to claim 8, wherein the curing comprises crosslinking and the tack deadening agent comprises a crosslinked tack deadening agent.

10. The carrier according to claim 9, wherein the crosslinked tack deadening agent comprises one or more of a crosslinked acrylic resin or a UV-crosslinked acrylic resin.

11. The carrier according to claim 9, wherein the crosslinking of the initial agent comprises one or more of free radical crosslinking through molecular double bonds, diazo crosslinking, or 2-2 cyclo-addition crosslinking.

12. The carrier according to claim 8, wherein the applying comprises printing.

13. The carrier according to claim 12, wherein the printing comprises one or more of inkjet printing, silk screen printing, transfer printing, or pad printing.

14. The carrier according to claim 12, wherein the initial agent comprises an acrylate-based inkjet ink.

15. The carrier according to claim 1, wherein each passivated element has a width of about 10 μm to 150 μm.

16. The carrier according to claim 1, wherein the passivated elements have a thickness of 6 μm to 20 μm.

17. The carrier according to claim 1, wherein the sum of the areas of the passivated zones equals 1% to 99% of the area of the adhesive layer.

18. The carrier according to claim 1, wherein the adhesive layer with the passivated elements distributed thereon has an overall tack that is 5% to 95% of an overall tack of the adhesive layer without the passivated elements distributed thereon.

19. The carrier according to claim 1, wherein:

the passivated elements are grouped in passivated regions on the adhesive layer;

each passivated region has a perimeter having a first perimeter segment and an opposing second perimeter segment;

each passivated region is bordered by a first adhesive layer region at the first perimeter segment of the passivated region and a second adhesive layer region at the second perimeter segment of the passivated region;

each passivated region has a tack that is less than the tack of the adhesive layer; and the adhesive layer and the passivated regions are configured to allow a device to contact the first and second adhesive layer regions adjacent the first and second perimeter segments of at least one of the passivated regions when the device is placed horizontally on the at least one of the passivated regions.

20. The carrier according to claim 1, wherein the adhesive layer has static dissipative properties with a surface resistance of greater than or equal to $10^9$ ohms both with and without the passivated elements distributed thereon.

* * * * *